(12) United States Patent
Thomsen et al.

(10) Patent No.: US 6,507,196 B2
(45) Date of Patent: Jan. 14, 2003

(54) BATTERY HAVING DISCHARGE STATE INDICATION

(75) Inventors: Jes Thomsen, Copenhagen (DK); Tore Rehnberg, Nol (SE)

(73) Assignee: Intra International AB, Göteborg (SE)

( * ) Notice: Subject to any disclaimer, the term of this patent is extended or adjusted under 35 U.S.C. 154(b) by 124 days.

(21) Appl. No.: 09/741,891

(22) Filed: Dec. 22, 2000

(65) Prior Publication Data

US 2002/0018927 A1 Feb. 14, 2002

Related U.S. Application Data

(63) Continuation of application No. PCT/SE99/01133, filed on Jun. 23, 1999.

(30) Foreign Application Priority Data

Jun. 24, 1998 (SE) .............................................. 9802241

(51) Int. Cl.$^7$ ............................................ G01N 27/416
(52) U.S. Cl. ...................................... 324/436; 324/435
(58) Field of Search ................................ 324/436, 435, 324/433, 430, 426, 434; 429/61, 90, 91, 92

(56) References Cited

U.S. PATENT DOCUMENTS

| | | | |
|---|---|---|---|
| 4,675,255 A | 6/1987 | Pfeifer et al. ................. | 429/92 |
| 5,496,658 A | 3/1996 | Hein et al. ..................... | 429/93 |
| 5,744,962 A * | 4/1998 | Alber et al. ................. | 324/426 |
| 6,388,423 B1 * | 5/2002 | Schilleci, Jr. ............... | 320/122 |

FOREIGN PATENT DOCUMENTS

EP 0355461 A2 2/1990

\* cited by examiner

Primary Examiner—Edward H. Tso
Assistant Examiner—Lawrence Luk
(74) Attorney, Agent, or Firm—Nixon & Vanderhye P.C.

(57) ABSTRACT

A storage battery of the conventional kind for supplying power to electrical devices has a supervising unit for determining the electric capacity. The supervising unit is electrically connected to terminal posts of the battery in order to measure the battery voltage and also measures the battery current. Measurement posts are connected to the end cells of the battery in parallel to the terminal posts and to the supervising unit through bridges. The supervising unit also measures the voltage between the measurement posts and the difference between the measured voltages is a measure of the current flowing through the battery, this difference voltage corresponding to a sum of the voltages over portions of the terminal posts and the bridges. From this difference voltage the current through the battery is calculated and therefrom the remaining electric capacity of the battery is determined by repeating regularly the measurement. The addition of measurement posts in a storage battery can be made rather easily by modifying the moulding of the terminal posts.

9 Claims, 3 Drawing Sheets

BATTERY HAVING DISCHARGE STATE INDICATION

This is a continuation of PCT application No. PCT/SE99/01133, filed Jun. 23, 1999, the entire content of which is hereby incorporated by reference in this application.

TECHNICAL FIELD

The present invention relates to a battery of primarily lead acid type comprising means for indicating the charge or discharge state of the battery.

BACKGROUND

Electro-chemical storage batteries are used in many applications and in a particular as starter batteries for powering the starter motor of a motor vehicle having an internal combustion engine. A battery conventionally comprises several electrolytic cells electrically connected in series with each other and containing plates submerged in an electrolyte. Batteries of this kind are disclosed in the published International patent applications WO 95/35228 and WO 96/11817 and in the published European patent application EP 0 692 413. In the batteries described in those patent applications an electrical control switch is connected between the middle cells of the batteries. The switch is controlled by electrical circuits protecting the vehicle from theft in which the battery is applied. In the cited International patent application WO 96/11817 also circuits are disclosed for monitoring the discharge and recharging currents of the battery, in particular for calculating and indicating the charge state of the battery, i.e. how much electrical energy there is still stored in the electrochemical system of the battery. Batteries having indication systems for the charge state are also frequently used in small electrically powered devices such as electrically powered razor devices and mobile telephones.

In the published European patent application 0 356 461 and U.S. Pat. No. 5,496,659 batteries having discharge or charge state indication are disclosed. In U.S. Pat. No. 4,675,255 and the German published patent application 36 28 600 external devices for monitoring the charge state of a battery are disclosed.

SUMMARY OF THE INVENTION

It is an object of the invention to provide a storage battery having a circuit for indicating the capacity state of the battery, which circuit is easily connected in a battery.

A storage battery of the conventional kind for supplying power to electrical devices comprises a supervising circuit or unit for determining the remaining electric capacity of the battery. The supervising unit is electrically connected to terminal posts of the battery in order to measure the battery voltage and is also arranged to measure the battery current. Therefor, the supervising unit is arranged to determine or measure the voltage over a portion of one of the terminal posts, this portion being used as a known series resistance of the cells of the battery. From this latter voltage the current through the battery is calculated and therefrom the remaining electric capacity of the battery is determined. The voltage indicating the battery current can be measured between a connection of the terminal post to the plates of the responsive cell of the battery and a position somewhere close to an exterior end of the terminal post, e.g. at the location, at which is passes through the lid or the case of the battery. Practically, measurement posts can be arranged, which are connected to the two end cells of the battery in parallel to the terminal post. Then, the supervising unit is connected to the measurement posts and measures the voltage between the two measurement posts or between a measurement post and some position on the terminal post connected parallel to the measurement post.

BRIEF DESCRIPTION OF THE DRAWINGS

The invention will now be described in detail by way of non-limiting embodiments with reference to accompanying drawings in which.

DESCRIPTION OF PREFERRED EMBODIMENTS

Figure 1:
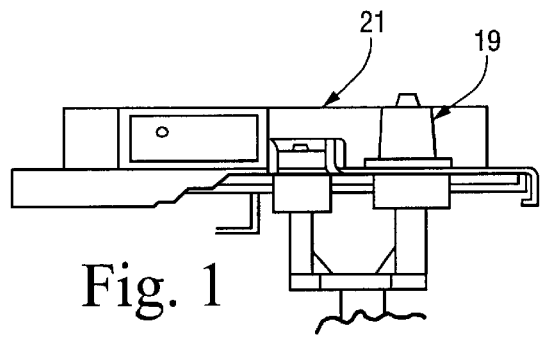
FIG. 1 is a fragmentary end view of a battery having extra discharge measuring facilities, where part of the case is cut away.
Figure 2:
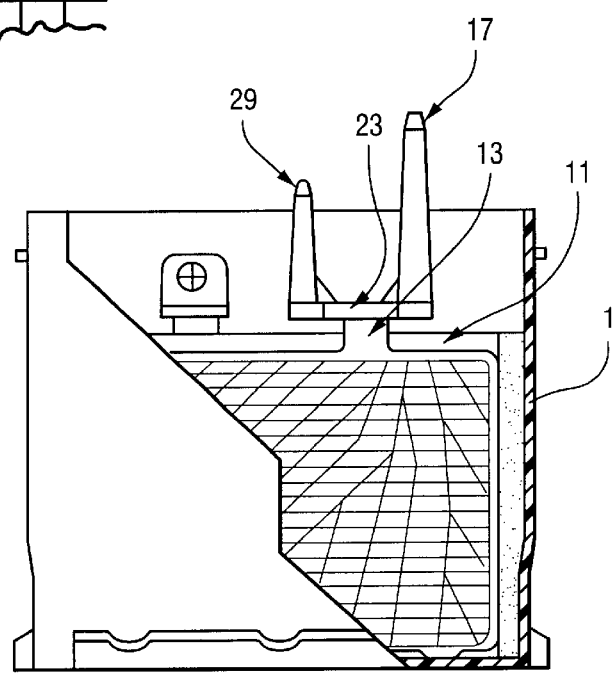
FIG. 2 is an end view of the battery according to FIG. 1.
Figure 3:
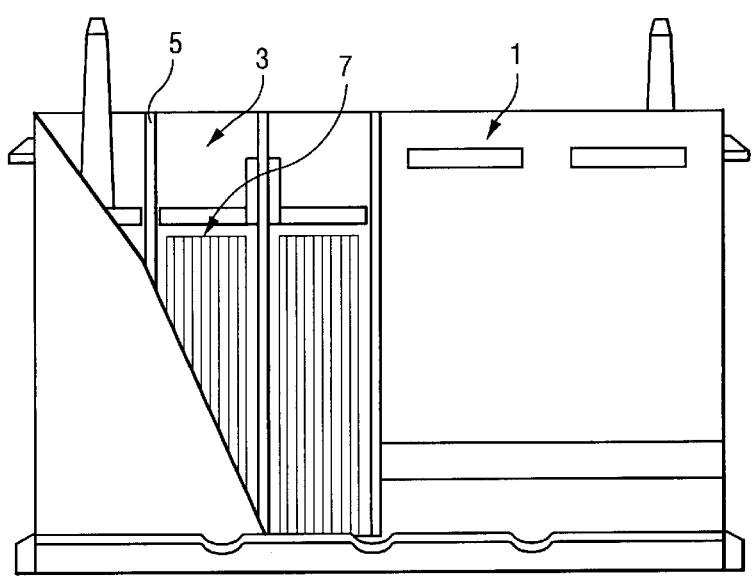
FIG. 3 is a front view of the battery according to FIG. 1, where part of the case is cut away.
Figure 4:
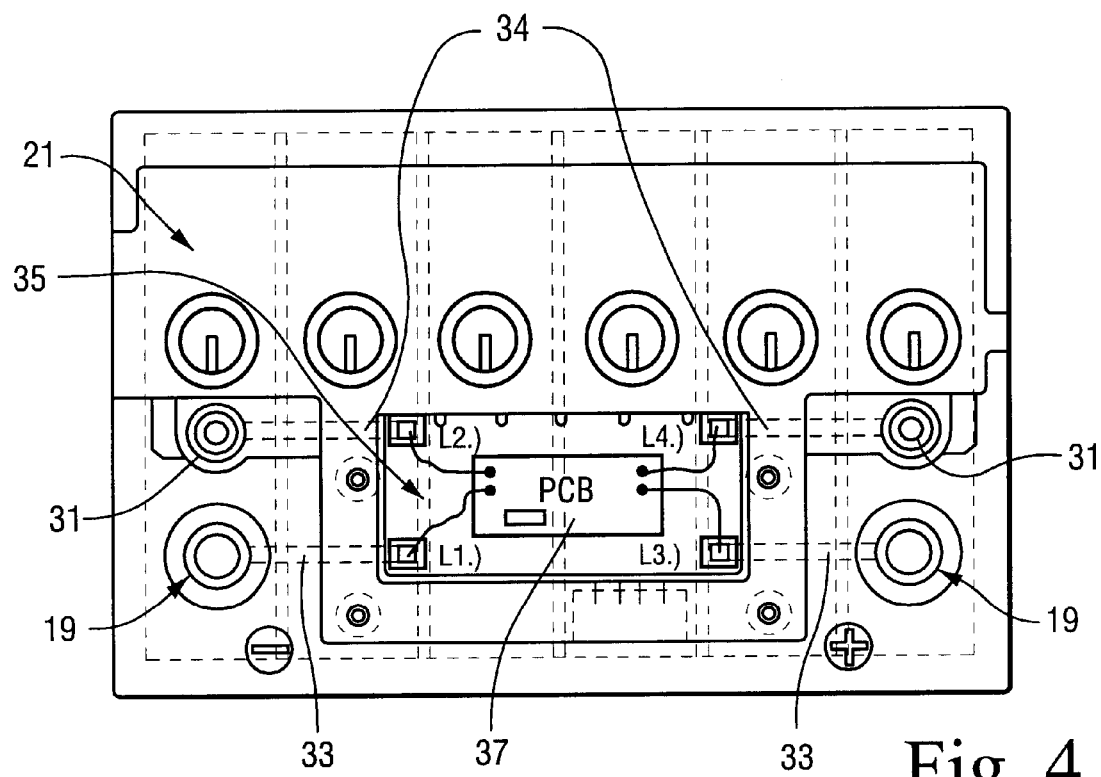
FIG. 4 is a top view of the battery according to FIG. 1.

In FIGS. 1–5 a battery is illustrated being constructed basically as disclosed in the cited European patent application 0 619 413. The battery comprises a case or vessel 1 made of a suitable plastics material. The vessel 1 is partitioned in a plurality of cells 3, here six cells, each cell being a narrow space having large sidewalls 5, which are also sidewalls of the neighbouring, parallel cell spaces. Each cell space 3 is filled with a plurality of parallel plates 7. Every second plate in cell 3 is in a lead acid type battery made of lead and is connected to the other second plates by means of a bridge 9. The plates 7 which thus are the electrodes of the battery are separated from each other by microporous plastic sheets, separators 11. Each plate 7 has at its top an upwards projecting part or lug 13 also made of lead. The lugs 13 are moulded into the bridge 9 which is a lead strip. Such a bridge electrically and mechanically connects all the positive plates in a cell space 3 to each other by a parallel connection. In the same way all the negative plates in a cell space are connected in parallel to a respective negative bridge 9. The moulding operation for connecting the plates 7 to the respective bridges 9 at the same time moulds connection elements 15 to the bridges 9, the connection elements 15 being used to connect the six cells of the battery in series with each other. For a lead acid type battery having six cells the battery will then provide nominal 12 V from the end poles of the battery.

In the same moulding operation terminal posts 17 are moulded which connect the two exterior cells of the battery with bushings 19. The terminal post bushings 19 are made of lead and are the contact places for connecting for finished battery to the system in which it is intended to be used, e.g. to the electrical system of a vehicle or a boat. The terminal post bushings 19 are located in and on top of a lid 21 closing the top side of the battery vessel 1.

Figure 5:
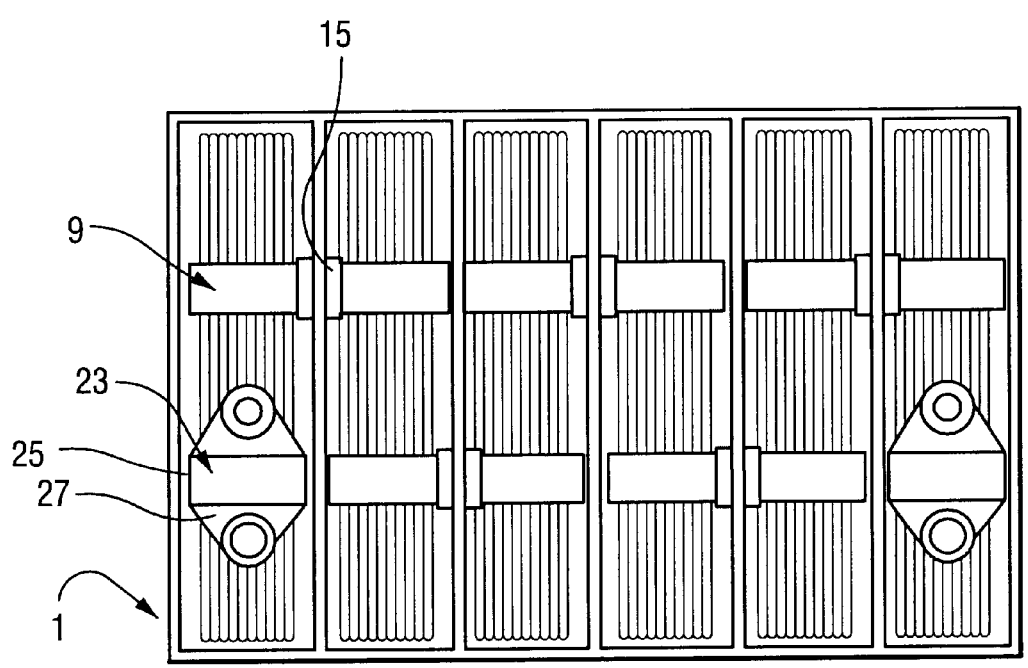
FIG. 5 is a top view of the battery according to FIG. 1, the lid of which is removed.

The bridges 23, which are located in the two exterior cells of the battery and are connected to the respective terminal posts 17, comprise a central strip 25 having the same design as the other bridges 9. From this central part 25 triangular flat parts 27 extend, having their large surfaces in parallel to the top edges of the plates 7. One of these triangular parts 27 carries the terminal post 17 and the opposite triangular part carries a measuring post 29. In the layout of the internal connections of the battery as illustrated in FIG. 5 all the bridges 9 are located having their centre lines located along two parallel lines, these two parallel lines beings spaced from each other and being located symmetrically, on opposite sides of the centre plane of the battery. The terminal posts 17 are then connected at the triangular parts 27 facing outwards from the battery, from the centre plane, and the measurement posts 29 are connected at the triangular parts 27 facing the centre plane of the battery. The measurement posts 29 have a smaller diameter than the terminal posts 17 and extend up into the lid 21 in a manner similar to that of the terminal posts 17, into a measurement bushing 31 attached to the lid 21. The measurement bushings 31 are lower than the terminal post bushings 19 and are substantially located inside the lid material, whereas the terminal post bushings are higher and have frusto-conical surfaces for external connection which are directly available from the top side of the battery.

From the bushings 19, 31 lead conductors 33, 34 extend in the plane of the lid 21 and are moulded to the respective bushings. The conductors 33 end in a cavity 35 in the centre of the lid 20 at the front side or half of the battery lid, where also the terminal post bushings 19 are located. Between the ends of the conductors 33, 34 a circuit board 37 is connected which comprises supervising or control electronic circuits such as a microprocessor which is located in the cavity or recess 35. The connection places or ends of the lead conductors 33, 34 at the circuit board 37 are denoted by L1, L2, L3 and L4, the connections places L1 and L3 being the ends of the lead conductors 33 from the terminal post bushings 19 and the connection places L2 and L4 being the ends of the lead conductors 34 from the measurement post bushings 31. The electronic circuits of the board 37 obtains electrical current for the operation thereof from the conductors 33 connected to the terminal posts 19, i.e. from the connection positions L1 and L3.

The electronic circuits of the board 37 are arranged to measure, at times occurring with a constant frequency, the voltage between the ends of the conductors 33 connected to the terminal posts 19 and the ends of the conductors 34 connected to the measurement posts 29, as will be described hereinafter. The measured values are used for determining whether the battery is in a rest state, i.e. a state in which the voltage differences are equal to zero. A reliable rest voltage has been achieved if no difference has existed during some least time at a predetermined temperature. Then the rest voltage can be translated or corrected as to the temperature to a secure remaining capacity of the battery. If an electrical current flows into or out of the battery, i.e., for a changing or discharging state, voltage differences occur. These differences can be converted to the current intensity, having a direction out of or into the battery, by the terminal posts acting as electric shunts. The measured currents multiplied by the times at which they occurred are added or subtracted from the last secure measurement of the remaining capacity. A preliminary remaining capacity is then obtained. The remaining capacity, the secure one and the preliminary one, can be communicated to the user of the battery or the user of the system in which the battery is connected through a linked display on an instrument panel of a vehicle, or by means of light emitting diodes on the lid of the battery or in some other way, not shown.

In normal use of the battery the preliminary or calculated remaining charge capacity value, which the operator obtains e.g. after driving during a day, indicates whether the car will the next morning be able to start or not. The secure or reliable remaining charge capacity value which is obtained after the rest of the vehicle over a night indicates with a good accuracy the real remaining charge capacity. Furthermore, a lowering of the real capacity as a function of time can provide an alarm that an electrical fault or a charging fault exists. This fault can then be handled before too little energy is left in the battery for starting the vehicle. These capacity values can be calculated by the supervising circuits of the circuit board as will be described hereinafter.

Figure 6:
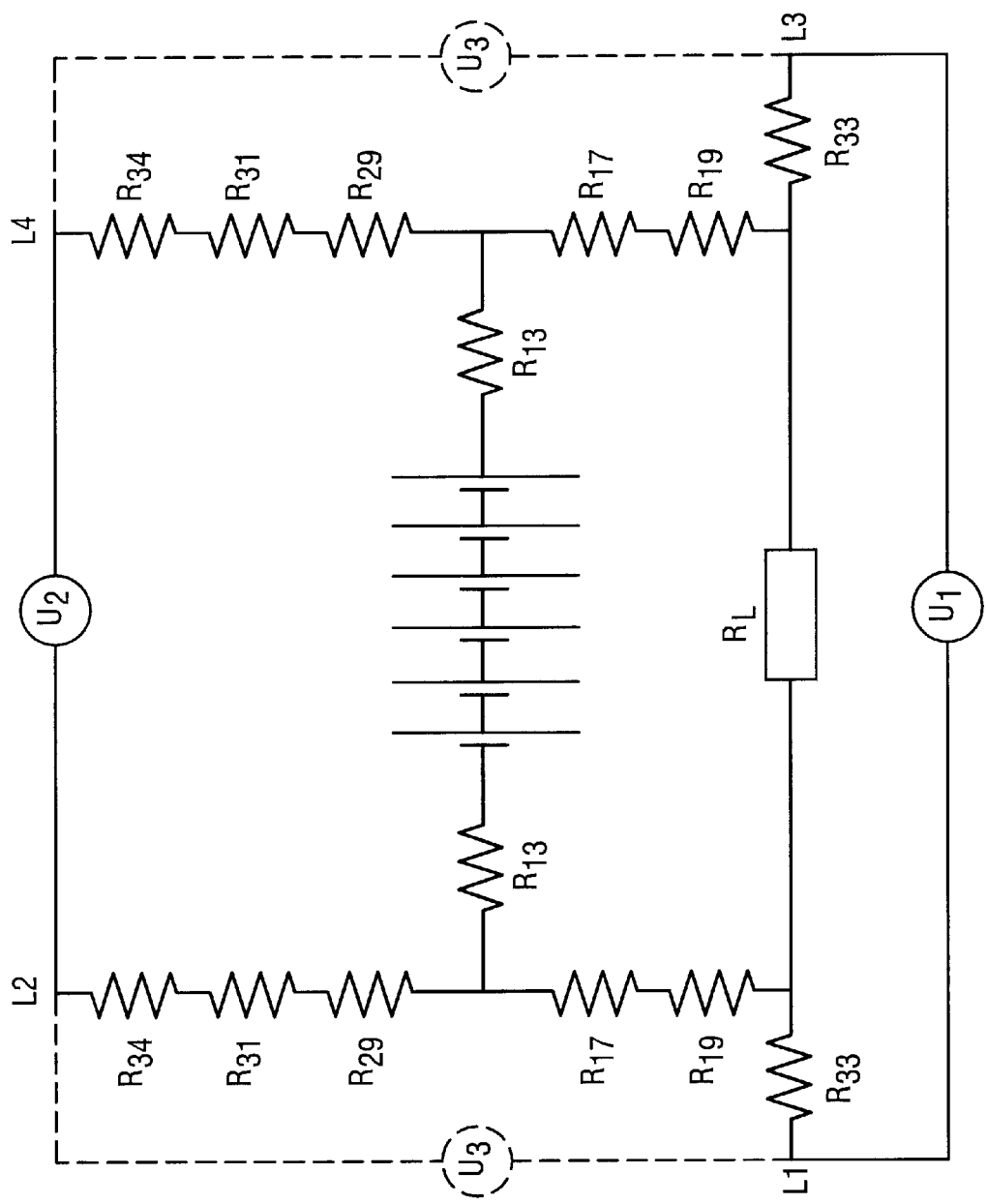
FIG. 6 is an equivalent circuit diagram of the battery according to FIG. 1.

The circuit diagram of FIG. 6 illustrates the connection of the battery to the supervising circuits of the circuit board 37. The six cells of the battery are connected to the exterior load $R_L$ through the resistances $R_{13}$ of the lugs 13 and $R_{17}$ of the terminal posts 17 and $R_{19}$ of the terminal post bushings 19. A first voltmeter $U_1$ is symmetrically connected to the cells of the battery through the resistances $R_{13}$ of the lugs 13, $R_{17}$ of the terminal posts 17, $R_{19}$ of their bushings 19 and $R_{33}$ of the parallel lead conductor 33. The first voltmeter $U_1$ is thus connected to the connection places L1 and L3, see FIG. 4. The voltmeter $U_1$ is a function of the supervising circuit of the circuit board 37. Furthermore, the cells of the battery are through the resistances $R_{29}$ of the measuring posts 29, $R_{31}$ of the measuring post bushings 31 and $R_{34}$ of the lead conductors 34 symmetrically connected to a second voltmeter $U_2$. The second voltmeter $U_2$ is thus connected to the connection places L2 and L4 see FIG. 4. The second voltmeter $U_2$ is another function of the supervising circuit of the circuit board 37.

From the values provided by the voltmeters $U_1$ and $U_2$ a difference voltage can be calculated and from the known resistances $R_{17}$ of the terminal posts 17 and $R_{19}$ of the bushings 19 thereof the intensity of the electrical current flowing through the battery cells can be calculated. Therefrom charge capacity values can be determined and calculated, which gives valuable information on the condition of the battery. First, when the battery is new and has not yet been used, the values provided by the voltmeters $U_1$, $U_2$ are calibrated. This is made by connecting the battery to a standard, known resistance load $R_{L,\,stand}$ and by making the voltmeter measure the respective voltages. From the readings provided by the voltmeters and the known load resistance value, the sum of the resistances $R_{17}$ of the terminal post 17 and $R_{19}$ of the bushing 19 thereof is calculated and, knowing this summed resistance, the measurements made by the voltmeters will then directly give information on the absolute value of the electrical current passing through the battery.

In using the battery for providing power to various electric devices, the supervising circuits will activate the second voltmeter $U_2$ at periodically recurring times to make a measurement. From the measured values the current through the battery is then calculated. By multiplying the calculated value of the electrical current by the time elapsed since the directly preceding measurement made, a value of the decrease of the electrical capacity of battery is obtained. This decrease value is subtracted from a value indicating the current charge capacity of the battery in order to update this value.

A reliable start value for the value indicating the current charge capacity is obtained by sensing, by the supervising circuits, whether the battery has been inactive during a sufficiently long time period and then determining the voltage of battery by activating the first voltmeter $U_1$. This is made by having the supervising circuits check the measurements by the voltmeters in order to determine whether no current has flown through the battery during each consecutive interval between the measurements and to evaluate the number of such consecutive intervals, during which the battery has been inactive. After a suitable number of consecutive intervals of inactivity the voltage of the battery is measured.

As is obvious from the circuit diagram of FIG. 6, one of the voltmeters $U_1$ and $U_2$ could be replaced by a third voltmeter $U_3$ connected to the conversion places L1 and L2 or to the connection places L3 and L4, this arrangement however giving an unsymmetrical measurement. Such a voltmeter is then connected to one of the end battery cells through two parallel conductor paths, a first path containing the resistances $R_{34}$ of the lead conductor 34, $R_{31}$ of the bushing 31 of the measurement post 29 and $R_{29}$ of this measurement post 29 and a second path containing the resistances $R_{33}$ of the parallel lead conductor 33, $R_{19}$ of the bushing 19 of the terminal post 17 and $R_{17}$ of this terminal post 17. This voltmeter $U_3$ would then also be a function of the supervising circuit of the circuit board 37 and it measures effectively the voltage over the resistance $R_{17}$ of the terminal post 17 and the resistance $R_{19}$ of its bushing 19 and therefor gives a voltage directly proportional to the current flowing through the battery. Of course, there could be made the same measurement of the current at both sides of the battery, i.e. having voltmeters between both the connection places L1 and L2 and the connection places L3 and L4, such an arrangement resulting in a higher measurement security or accuracy.

The voltmeters $U_1$, $U_2$ (or $U_3$) and the calculating functions described above can all be incorporated in a supervising unit such as a standard microprocessor operating according to a suitable program.

What is claimed is:

1. A storage battery for supplying power to electrical devices, the battery comprising:
   a battery vessel and a lid arranged on the vessel,
   several cells arranged in the battery vessel and electrically connected in series with each other, so that two end cells are formed,
   exterior terminal posts, electrically connected to the two end cells and extending from plates in an end cell through the lid or vessel to the exterior,
   a supervisor unit for determining the remaining electric capacity of the battery, the supervising unit being electrically connected to the terminal posts and arranged to measure a first voltage between the terminal posts,
   characterized in that the supervising unit is arranged to measure a second voltage from which a third voltage over part of at least one of the terminal posts is obtained, to calculate from the third voltage the current through the battery and to determine, from the calculated current and the first voltage, the remaining electric capacity of the battery.

2. A storage battery according to claim 1, characterized in that the supervising unit is arranged to measure the second voltage so that the third voltage is a voltage between a connection of a first one of the terminal posts to the plates in the end cell and place at an exterior end of the first terminal post or this voltage added to a voltage between a connection of a second one of the terminal posts to the plates in the end cell and a place at an exterior end of the second terminal post.

3. A storage battery according to claim 1, characterized in that the supervising unit is arranged to measure the second voltage so that the third voltage is a voltage between a connection of the thermal post to the plates in the end cell and a place on the terminal post, at which is passes through the lid or the vessel.

4. A storage battery according to claim 1, characterized by measurement posts, each measurement post being connected to a separate one of the two end cells and each measurement post being arranged in parallel to a terminal post, the supervising unit being connected to the measurement posts and arranged to measure the second voltage as a voltage between a position on a first measurement post and a similarly located position on a second measurement post.

5. A storage battery according to claim 1, characterized by measurement posts, each measurement post being connected to a separate one of the two end cells and each measurement post being arranged in parallel to a terminal post,
   the supervising unit being connected to at least one of the measurement posts and arranged to measure the second voltage as a voltage between a measurement post and a place on that terminal post, which is connected to the end cell, to which the measurement post is connected, the place being located at an exterior end of the terminal post.

6. A storage battery according to claim 1, characterized in that the supervising unit is arranged to measure, in an initial phase, when the battery is first connected to a load, this load being a known resistance, the second voltage and to determine from the second voltage and resistance of the part of the at least one of the terminal posts, and
   that the supervising unit is arranged to use the determined resistance in calculations of the remaining electric charge capacity of the battery.

7. A storage battery according to claim 1, characterized in that the supervising unit is arranged to measure the second voltage at times occurring periodically in time and to calculate for an interval between two consecutive times the electric charge capacity drawn from the battery during this interval.

8. A storage battery according to claim 7, characterized in that the supervising unit is arranged to subtract the calculated electric charge capacity drawn from the battery during an interval from a current capacity value indicating the remaining charge capacity of the battery in order to determine the current capacity value.

9. A storage battery according to claim 1, characterized in that the supervising unit is arranged to measure the second voltage at times occurring periodically in time in order to determine whether the no current has flowed through the battery during a predetermined time period and to measure, in the case where it has determined that no current has flowed during the predetermined time period, the first voltage and to calculate from the measured value of the first voltage a reliable current capacity value indicating the remaining charge capacity of the battery.

\* \* \* \* \*